United States Patent [19]

Yukawa

[11] Patent Number: 4,763,300
[45] Date of Patent: Aug. 9, 1988

[54] FRONT LOADING APPARATUS FOR A MEMORY CARTRIDGE UTILIZED FOR A DATA PROCESSING MACHINE

[75] Inventor: Masayuki Yukawa, Kyoto, Japan

[73] Assignee: Nintendo Co., Ltd., Kyoto, Japan

[21] Appl. No.: 900,717

[22] Filed: Aug. 27, 1986

[30] Foreign Application Priority Data

Aug. 28, 1985 [JP] Japan ................ 60-190372

[51] Int. Cl.$^4$ ............ G11C 17/00; H05K 5/04; H05K 5/06
[52] U.S. Cl. ................. 365/52; 361/399
[58] Field of Search ............ 365/52; 361/399; 273/85 G

[56] References Cited

U.S. PATENT DOCUMENTS

| | | | |
|---|---|---|---|
| 3,883,856 | 5/1975 | Saito et al. | 365/105 |
| 4,095,791 | 6/1978 | Smith et al. | 273/85 G |
| 4,149,027 | 4/1979 | Asher et al. | 174/52 R |
| 4,352,492 | 10/1982 | Smith | 273/16 C |
| 4,602,351 | 7/1986 | Shimamura et al. | 365/52 |

*Primary Examiner*—Terrell W. Fears
*Assistant Examiner*—Melissa J. Koval
*Attorney, Agent, or Firm*—Larry A. Jackson

[57] ABSTRACT

A front loading apparatus typically installed in a data processing machine for receiving a memory cartridge. The apparatus includes a frame disposed within the machine, and a tray pivotally mounted to the frame for rotation between a loading and an operating position. It also includes a spring biasing the tray toward the loading position and a releasable lock for retaining it in the operating position. A low insertion force edge connector is mounted to the frame for electrically interconnecting a printed circuit board in the cartridge with a second printed circuit board mounted in the machine.

17 Claims, 7 Drawing Sheets

FRONT LOADING APPARATUS FOR A MEMORY CARTRIDGE UTILIZED FOR A DATA PROCESSING MACHINE

BACKGROUND OF THE INVENTION

1. Field of the Invention

The present invention relates to a front loading apparatus for a memory cartridge and more specifically to a front loading machines for a memory cartridge for data processing machines such as home TV game machines and personal computers which perform processing based on the contents of a memory cartridge loaded into the machine.

2. Description of the Prior Art

In data processing machines of the type mentioned above, a memory cartridge or a memory cassette which accommodates a non-volatile memory such as a ROM for storing various programs and data therein is used. Typically, such memory cartridges are designed to be positioned and retained in the data processing machine by a loading apparatus.

One example of a conventional memory cartridge and an associated loading apparatus is disclosed in U.S. Pat. No. 4,095,791 issued on June 20, 1978. In this device, most of the memory cartridge protrudes from the loading apparatus and exposes the printed circuit board built in the memory cartridge to spurious radiation.

Also, in conventional loading apparatuses, when the cartridge is loaded, the edge of the printed circuit board mounted in the cartridge is forced into a connector located in the data processing machine. In the process the connecting electrodes on the board are abraded, and with repeated loading and unloading, are gradually worn away. This results in poor contact between the connector and the cartridge. Furthermore, in the conventional apparatus, a significant amount of force is required to insert the printed circuit board into the connector, making it difficult for a small child to operate the machine.

SUMMARY OF THE INVENTION

Therefore, a principal object of the present invention is to provide a novel front loading apparatus for a memory cartridge.

Another object of the present invention is to provide a front loading apparatus which will minimize the exposure of the cartridge to spurious radiation.

Still another object of the present invention is to provide a front loading apparatus which will minimize the abrasion of the connecting electrodes of the circuit board of the memory cartridge.

In summary, the present invention is a front loading apparatus for a data processing machine for loading a memory cartridge into the machine. The cartridge is of the type having a printed circuit board mounted in it such that one edge of the board is exposed at the insertion end of the cartridge. The apparatus includes a tray for holding the cartridge and a frame to which the tray is pivotally mounted. The tray is mounted to permit rotation between a cartridge loading position and a cartridge operating position and is biased toward the loading position by a spring means. Also included is a low insertion force connector mounted to the frame for electrically interconnecting the cartridge circuit board to a second circuit board mounted in the data processing machine. Finally, a releasable locking mechanism for retaining the tray in the operating position is provided.

When the tray is positioned in the cartridge loading position the memory cartridge can be inserted into it through an inlet port located at the front of the tray. As the memory cartridge nears the rear of the tray the printed circuit board enters the connector. When the cartridge is fully inserted in the tray it can be rotated downward by pressing on the top of the cartridge or the front of the tray. During this downward rotation, connecting electrodes on the exposed edge of the cartridge circuit board are pressed into firm contact with corresponding contacts in the connector. When the tray reaches the cartridge operating position, it is secured in that position by the releasable locking mechanism.

In accordance with the present invention, when the memory cartridge is loaded it is located fully within the front loading apparatus, and therefore it is substantially shielded from spurious radiation. Also, the connecting electrodes of the cartridge circuit board and the contacts of the connector are pressed into firm contact after the board has been inserted so as to minimize insertion force and abrasion of of the board electrodes. As a result, the loading or unloading of the the memory cartridge becomes relatively easy and the service life of the memory cartridge is extended.

These objects and other objects, features, aspects and advantages of the present invention will become more apparent from the following detailed description of the embodiments of the present invention when taken in conjunction with accompanying drawings.

DESCRIPTION OF THE PREFERRED EMBODIMENTS

Figure 1A:
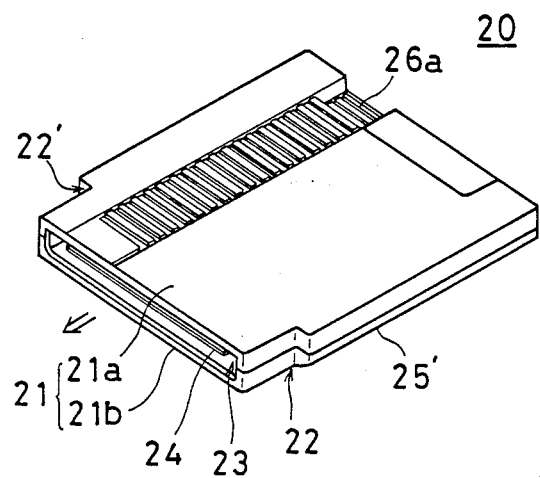
FIG. 1A and FIG. 1B are perspective views showing one example of a memory cartridge which can be loaded in a loading apparatus in accordance with the present invention.
Figure 1B:
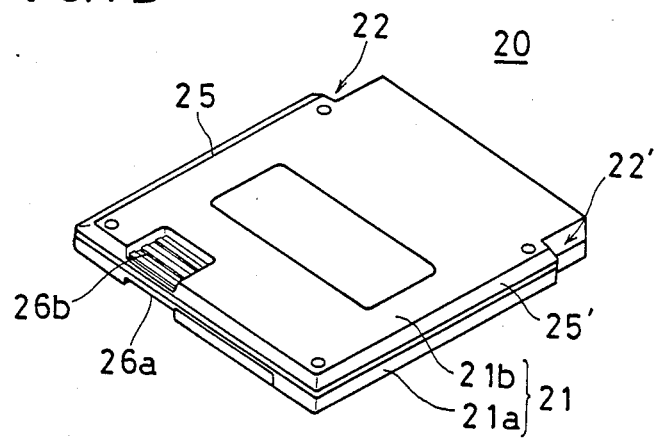

FIG. 1A and FIG. 1B are perspective views showing one example of a cartridge adapted for use with a front loading apparatus in accordance with the present invention. A cartridge 20 comprises a case 21 having an upper half 21a and a lower half 21b. A rectangular opening 23 is formed at the front side of the case 21 in the direction of insertion (direction shown by an arrow in FIG. 1A), and the tip of printed circuit board 24 accommodated in the case 21 is exposed inside the opening 23. Within case 21, a memory (not illustrated) such as a ROM or a RAM is mounted on the printed circuit board 24. If the cartridge 20 is employed for a video game apparatus, then game programs, character data and the like will be stored in such a memory.

Figure 2:
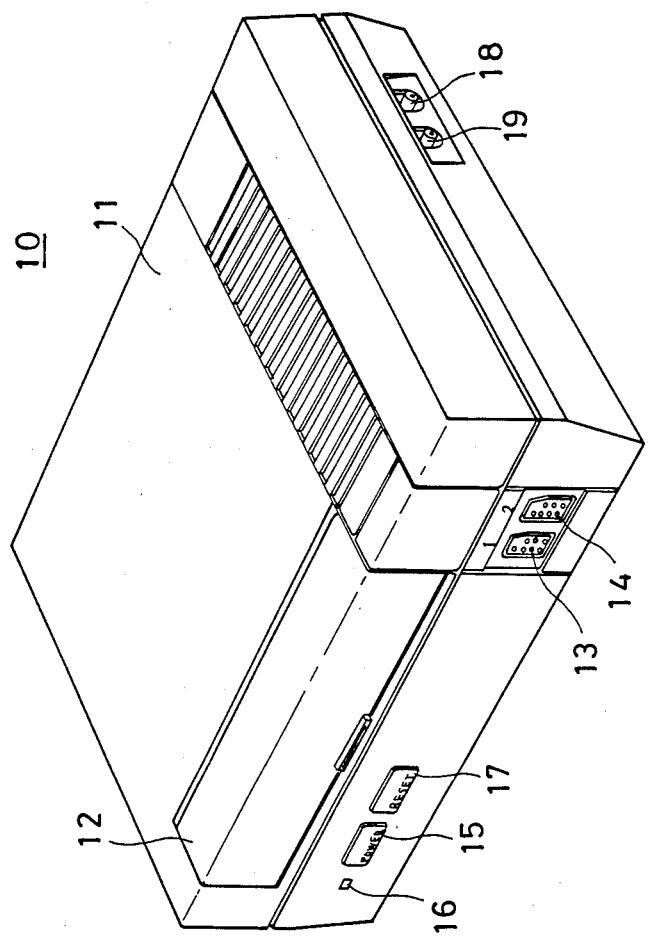
FIG. 2 is a perspective view showing a home TV game machine as one example of a data processing machine incorporating the present invention.

The cartridge 20 is inserted into a game machine main unit 10 shown in FIG. 2 in the direction indicated by the arrow in FIG. 1A with the upper half 21a thereof turned upward as shown in FIG. 1A. Stepped portions 22 and 22' act as stops for limiting the extent to which the cartridge 20 can be inserted into the loading apparatus. Concave portions 26a and 25b are formed at the rear of the upper and lower halves of the case to provide gripping surfaces for the user's fingers to facilitate removal of the cartridge from the loading apparatus.

The concave portion 26b of the lower half 21b also cooperates with the front loading apparatus to prevent the normal loading of a cartridge other than an authentic or genuine one in the loading apparatus. Specifically, concave portion 26b enables loading only of an authentic cartridge having a concave portion equivalent in depth and position to the concave portion 26b and prevents normal loading of a cartridge lacking this characteristic. This aspect of the invention is discussed in more detail below.

As is well understood from FIG. 1B, chamfered portions 25 and 25' having a certain incline are formed at opposite sides of the lower half 21b. These chamfered portions 25 and 25' are for preventing an inverted insertions of cartridge 20. Note that the corresponding sides of the upper half 21a have a different shape from that of these chamfered portions. This main unit 10 includes a case 11 which is preferably formed of a conductive material such as metal; however, the case 11 may be formed of a non-conductive material such as a plastic. Lid 12 is mounted for rotation at the forward portion of the top surface of the case. Also, a front loading apparatus 30 according the present invention is mounted in the case and is described in greater detail below.

Jacks 13 and 14 are installed on the front surface of the case 11, and a manual controller (not illustrated) may be connected to these jacks. Also, on the lower part of the front surface of the case 11, a power switch 15, a light emitting diode 16 for indicating the switch position and a reset switch 17 are installed. Also, on the right side surface of the case 11, an external audio terminal 18 and an external video terminal 19 for providing signals to an image displaying apparatus are located.

Figure 9:
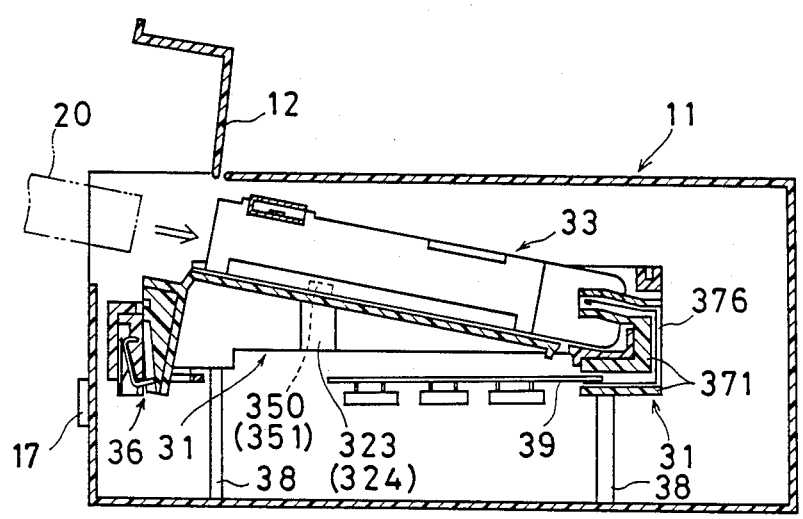
FIG. 9 is a sectional view of the home TV game machine of FIG. 3 in which the present invention is installed.

The front loading apparatus 30 comprises a frame 31 which is fixed in the case 11 (FIG. 2), preferably by screws through spacers 38 as shown in FIG. 9. The frame 31 is formed of a conductive material such as metal and is connected to ground potential. However, the frame 31 may be formed by a non-conductive material such as plastics.

Figure 3:
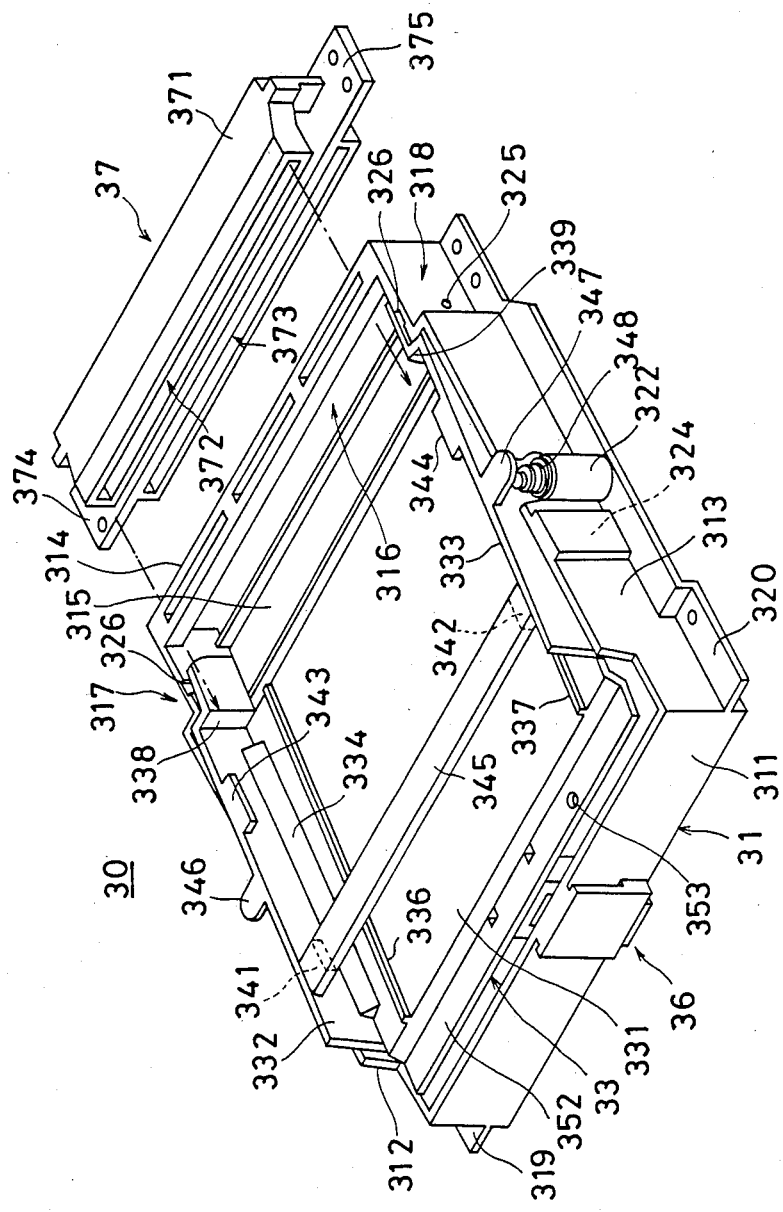
FIG. 3 is a perspective view showing one embodiment of the present invention.

As shown in FIG. 3, the frame 31 has a front wall 311 and side walls 312 and 313 each adjoining the front wall. Connecting parts 314 and 315 extend between side walls 314 and 315 at the rear. Formed between these connecting parts is an elongated opening 316 adapted to receive the upper portion of edge connector 37 as shown in FIG. 9.

Rear portions 317 and 318 of side walls 312 and 313 are inwardly offset as shown in FIG. 3. Also, flanges 319 and 320 are formed on the outer surfaces of the side walls 312 and 313, respectively, and include mounting holes 319a and 320a through which fasteners may be passed to attach the frame 31 to the case 11 as illustrated in FIG. 9.

Cylindrical spring shoes 321 and 322 are formed on the outer surface of the side walls 312 and 313. Recesses 323 and 324 are also formed in the side walls just forward of the spring shoes. These recesses cooperate with protrusions on the side walls of the tray to limit the rotational movement of the tray as will be discussed below. These recesses extend vertically from the bottom of the side walls to a height of about two thirds of the wall height.

Figure 6:
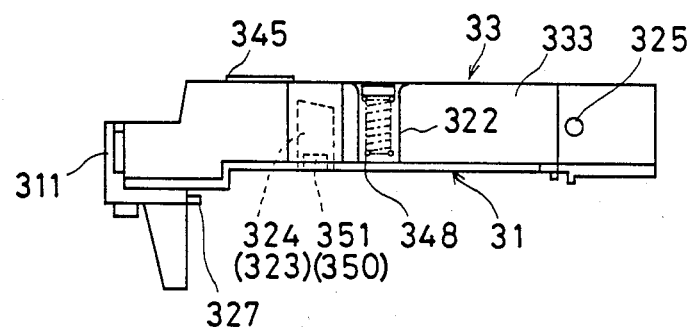
FIG. 6 is a side view of the embodiment of FIG. 3.

The tray 33 is formed by a conductive material such as metal; but it may also be formed by a non-conductive material such as a plastic. The tray 33 comprises side walls 332 and 333 and a bottom plate 331 extending between the side walls. The shape and area of the bottom plate 331 are selected so that the tray will accommodate cartridge 20. The tray is pivotally mounted at the rear to the frame by means of a shaft (not shown) which extends from side walls 332 and 333 through holes 325 and 326 formed in rear portions 317 and 318, respectively, of the frame. When so mounted, the tray is capable of being rotated between a cartridge loading position as shown in FIG. 9 and a cartridge operating position as shown in FIG. 6. Referring to FIG. 9, it can be seen that when the tray is in the loading position, its forward end or port is by raising lid 12.

Members 334 and 335 having triangular cross-sections are fixed to the intersection of bottom plate 331 and the side walls 332 and 333. The angles of these members 334 and 335 to the bottom plate 331 correspond to the angles of the chamfered portions 25 and 25' of the cartridge 20 (FIG. 1B). As the cartridge is inserted in the tray these members slidably contact the chamfered portions of the cartridge. If a user attempts to insert the cartridge upside down, it will be obstructed by these members because upper half 21a of the cartridge does not have chamfered portions. Thus these members act to prevent an inverted insertion of the cartridge.

Rails 336 and 337 formed in bottom plate 331 of the tray act as contact surfaces for the lower half 21b of the cartridge. Their purpose is to reduce friction between the cartridge and the tray by reducing the area of the contacting surfaces between the two. Preferably the rails have a rectangular cross section but other shapes such as an arc shaped cross section can also be employed. Also, these rails act as reinforcing members for the bottom plate 331 to prevent excessive warping.

Stepped portions 338 and 339 corresponding to offset portions 317 and 318 of the frame 31 are formed at the rear end portions of the side walls 332 and 333 of the tray 33. When the cartridge is fully inserted into the tray these stepped portions 338 and 339 engage stepped portions 22 and 22' of the cartridge 20 to limit the distance the cartridge can be inserted into the tray.

Upward movement of the cartridge in the tray is limited by protrusions 343 and 344 which extend inward from side walls 332 and 333, respectively. It is also limited by protrusions 341 and 342 which extend inward from the side walls beneath reinforcing bar 345.

Reinforcing bar 345 is mounted on protrusions 341 and 342 as shown in FIG. 3. This reinforcing bar 345 connects the side walls 332 and 333 to prevent the bottom plate 331 from warping. Also, the bar will obstruct the insertion of the cartridge if the user inadvertently attempts to insert the cartridge when the tray is in the operating position.

If the reinforcing plate 345 is composed of a conductive material and is connected electrically to the frame 31, the reinforcing plate 345 acts also as a discharging means for discharging charges on the case 21 created in inserting the cartridge 20. Such charges may be discharged when the cartridge 20 is inserted into the tray 33 and the surface of the upper half 21a of the case 21 is brought in contact with the reinforcing plate 345. The charges stored on the case 21 are discharged through this reinforcing plate 345 to the potential of the frame 31; that is, the ground potential. Accordingly, the electrical bombardment of electronic components (not illustrated) mounted on the printed circuit board 24 in the case 21 is prevented, and these electronic components are protected effectively from static electricity.

At the top of the side walls 332 and 333 of the tray 33, outwardly protruding spring stop pieces 346 and 347 are formed so as to be centered above spring shoes 321 and 322. Coil springs 348 are held in the spring shoes by these spring stop pieces 346 and 347. As described above, the tray 33 is supported by the shaft (not illustrated) protruding through the shaft holes 325 so as to be rotatable around this shaft. Normally the the tray 33 is biased upwardly by these coil springs 348. The upper limit of rotation of the tray 33 is defined by protrusions 350 and 351 which extend into engaging grooves 323 and 324 respectively formed on the inner surface of the side walls 312 and 313. When these protrusions have moved to the upper limit of the engaging grooves, the tray 33 is positioned in loading position.

Figure 4:
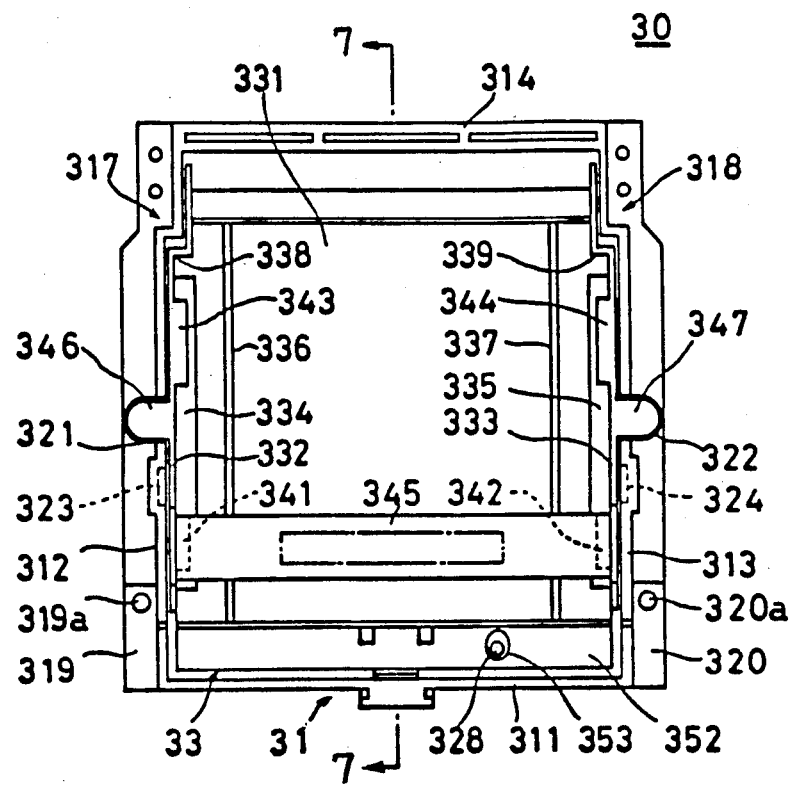
FIG. 4 is a plan view of the embodiment of FIG. 3.
Figure 5:
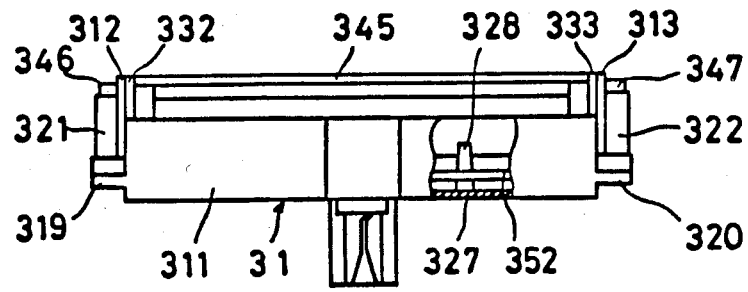
FIG. 5 is a partly broken front view of the embodiment of FIG. 3.

At the front end of the bottom plate 331 of the tray 33, a stepped portion 352 is formed and a hole 353 is formed at a predetermined position of this stepped portion 352. Inside the front wall 311 of the frame 31, a holding plate 327 is formed under the stepped portion 352 thereof (see FIG. 4). A cylindrical protrusion 328 extends upward a pre-determined distance from this holding plate 327. The outer diameter of the cylindrical protrusion 328 is a little smaller than the inner diameter of the hole 353. Also, the height of the cylindrical protrusion 328 is selected so that the top thereof extends beyond the top surface of the bottom plate 331 by a length approximately equal to the depth of the concave part 26b (FIG. 1B) of the lower half 21b. Accordingly, the tray 33 is allowed to rotate downward until the concave face of the concave part 26b contacts the top of the cylindrical protrusion 328. Thereby, the normal loading of the cartridge 20 is made possible. If a cartridge not having a recess equivalent to recess 26b is inserted, the top of the cylindrical protrusion 328 contacts the bottom of the cartridge and further downward rotation of the tray 33 is prevented. Thus, the cylindrical protrusion 328 plays the role of inhibiting loading of a cartridge of a shape other than that of cartridge 20, that is, a false cartridge.

Although concave portion 26b is preferably formed to also function as a gripping surface, a differently shaped recess could be substituted. For example a cylindrical recess or hole just large enough in diameter to accommodate protrusion 328 could be substituted.

A locking mechanism 36 is installed in front wall 311 of the frame 31 and the stepped portion 352 of the bottom plate 331 of the tray 33. This locking mechanism 36 comprises a key mechanism 36a equivalent to a key and a cam mechanism 36b equivalent to a lock. The key mechanism is attached to front wall 311 and the cam mechanism is incorporated in stepped portion 352 of the front end of 25 in the bottom plate 331 of the tray 33.

Figure 7:
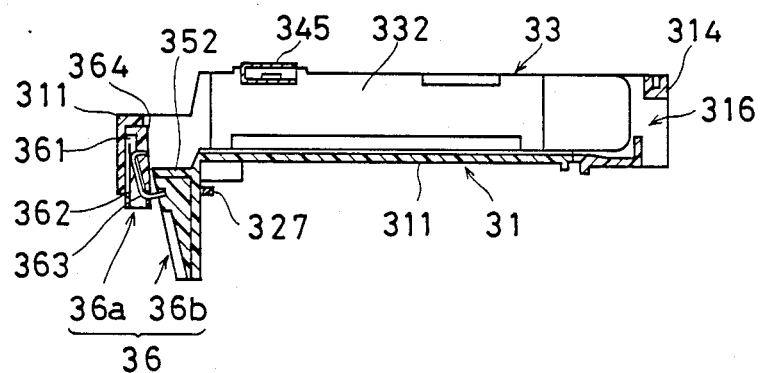
FIG. 7 is a cross-sectional view taken along 7—7 of FIG. 4.

As shown in FIG. 7, the key mechanism 36a comprises an engaging groove 361 formed on the back side of the front wall 311, and a plate spring 362 fixed to this engaging groove 5. U-shaped hook pin 363 is biased toward the cam mechanism 36b by this plate spring 362. The top end of the hook pin 363 is fixed to holder 364 and the bottom end of the pin is capable of pivoting.

Figure 8:
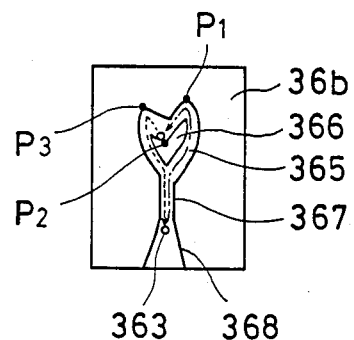
FIG. 8 is a partial front view of the embodiment of FIG. 3 showing a portion of the locking mechanism.

As shown in FIG. 8, the cam mechanism 36b includes a heart shaped groove 365 which is a little wider than the thickness of the above-mentioned hook pin 363. An egaging protrusion 366 is surrounded by this heart-shaped groove 365. Also, a groove 367 extends downward from the bottom end of the heart-shaped groove 356, and has a trumpet-shaped portion 368 at its lower end.

Normally the tray 33 is held in the loading position as shown in FIG. 9 by the coil spring 348. When the cartridge 20 is loaded, it is inserted into the space which is defined by the bottom plate 331 and the side walls 332 and 333 of the tray 31. Then, the tray 33 is pushed down against the spring force of the coil springs 348. At this time, since the top end of the hook pin 363 is supported in a fixed fashion by the holding piece 363, the cam mechanism 36b is guided by the bottom end of the hook pin 363, the portion 368, the groove 367 and the heart-shaped groove 365 on the right of the engaging protrusion 366. This means that the cam mechanism 36b is displaced so that the bottom end of the hook pin 363 moves in the heart-shaped groove 365 and follows a path as shown by a dash-dot line FIG. 8. Accordingly, the bottom end of the hook pin 363 is brought to the position of point P1 as shown in FIG. 8. Thereafter, when downward pressure on the tray 33 is relaxed, it is moved upward by the force of the coil springs 348. Then, the bottom end of the hook pin 363 engages a U-shaped concave part of the top side of the engaging protrusion 366, and travels to position P2 and thereby locking the tray. This means that the tray 33 remains in the operating position as illustrated in FIG. 7.

In order to remove the cartridge the tray must first be pressed downward. As the tray travels downward, the heart-shaped groove 365 reaches the bottom end of the hook pin 363 at point P3. Then downward pressure on the tray is released and bottom end of the hook pin 363 moves along the heart-shaped groove 365 on the left of the engaging protrusions 336, the groove 367 and the trumpet-shaped portion 368, as shown by a dotted line in FIG. 8. When the pin passes the bottom of portion 368, the tray is released.

As is described above, in the cam-system locking mechanism 36 of this embodiment, the tray 33 is locked by pressing the tray downward and released by pressing it downward a second time. It is possible of course to substitute other locking mechanisms for the one described.

As shown in FIG. 3, opening 372 of the connector 37 is accessible through opening 316 of the rear end of the frame 31. The connector 37 comprises a case 371 which has a U-shaped cross section as shown in FIG. 9 and is elongated when viewed from the front. Upper and lower spaced openings 372 and 373 are formed in the front of case 371. As is well understood from FIG. 10, the edge portions of the printed circuit board 24 of the cartridge 20 and printed circuit board 39 of the game machine main unit 10 are inserted into these openings 372 and 373 respectively, and are thereby interconnected electrically.

Figure 10:
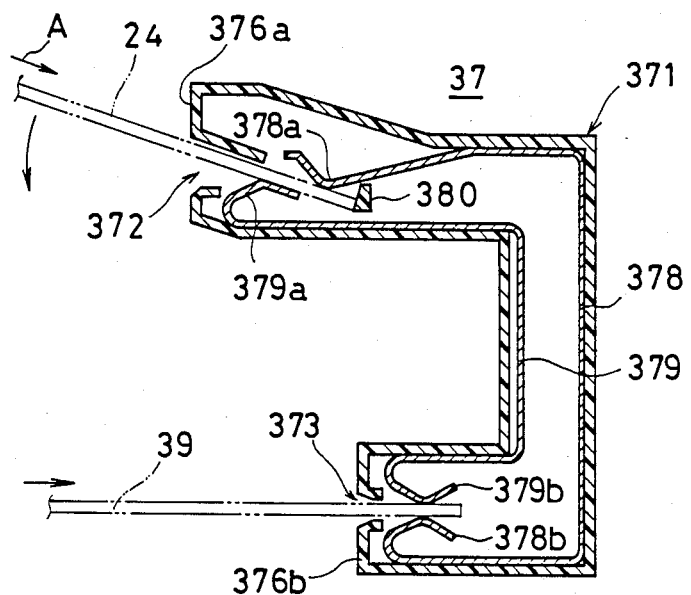
FIG. 10 is a cross-sectional view of the low insertion connector of the present invention.

As shown in FIG. 9 and FIG. 10, the front end 376a of the top side of the case 371 protrudes forward beyond the front end 376b of the bottom side thereof.

Accordingly, the opening 372 is located forward from the opening 373. When the cartridge is loaded the printed circuit board 24 of the cartridge is inserted obliquely into the opening 372 and the opening is shaped to accommodate such insertion. On the other hand, opening 373 is shaped to accommodate a horizontal insertion of board 39.

A large number of pairs of U-shaped spring electrodes 378 and 379 are accommodated in the case 371. These pairs of spring electrodes 378 and 379 are spaced apart in the direction of width of the connector 37. Grooves or partitions (not illustrated) are preferably formed on the inner surface of the case 371 at equal intervals to locate such spring electrodes 378 and 379.

The lower ends of each pair of the spring electrodes such as electrodes and 379 are bent inward in a U-shaped fashion, forming contacts 378b and 379b. Also, upper end of the spring electrode 379 is bent inward in a U-shaped fashion to form a contact 378a. The upper end of the spring electrode 378 is bent outward in a V-shaped fashion in the vicinity of the opening 372, and the tip thereof is folded back in a V-shaped fashion, thereby forming contact 379a. These upper contacts 378a and 379a are spaced from each other in the direction of insertion of the printed circuit board 24 as shown by an arrow A, and an interval equal to or somewhat larger than the thickness of the printer circuit board 24 is created between the two when viewed in the direction of insertion. Stop 381 for limiting the insertion of the printed circuit board 24 is formed at a position which is beneath and recessed beyond contact 378a.

The reason why the contact parts 378a and 379a are spaced in the direction of insertion of the printed circuit board 24 is to facilitate the loading of the cartridge 20. When the cartridge 20 is loaded, it is inserted into the tray. During the rotation of the tray and cartridge, contacts 379a act as fulcrums, causing connecting electrodes (not illustrated) formed on the upper surface of the edge portion of the printed circuit board 24 to move upward and press firmly against contacts 378a. Similarly, electrodes on the lower surface of the board are pressed against contacts 379a. This means that in accordance with the present invention when the printed circuit board 24 of the cartridge 20 is inserted into connector 37, contacts 378a and 378b exert only a minimal force against the connecting electrodes.

In order to play a game using the game machine main unit 10 (FIG. 2), the sound external terminal 18 and the video external terminal 19 are first connected to a CRT (not illustrated) such as a home TV set. Thereafter, the lid 12 is opened, and the cartridge 20 is inserted into the tray 33 with the lower half 23b thereof positioned downward (FIG. 7) until stepped portions 22 and 22' of the cartridge 20 engage stepped portions 338 and 339 of the tray 33. At this point, the entire cartridge 20 is located within the tray 33. Also, the upper portion 376a of the connector has entered opening 23 of the cartridge 20. As shown in FIG. 10, when the tray is in the loading position the printed circuit board 24 has a predetermined angle, of about 10 degrees with respect to the printed circuit board 39 of the game machine unit 10. In this position the spring electrodes of the connector and the connecting electrodes of the printed circuit board 24 are not in the state of complete contact.

Subsequently, the cartridge 20 and the tray 33 are pushed downward. If an authentic cartridge has been inserted, the tray 33 will rotate into the operating position and the locking mechanism 36 will lock the tray in that position. Accordingly, as described previously, as the tray is rotated, the connecting electrodes of the printed circuit board 24 are brought into firm contact with corresponding spring electrodes 378 and/or 379 in connector 37. Thereafter, the lid 12 (FIG. 2) is closed, and the game can be performed using a controller (not illustrated).

When the game ends, or is terminated, the lid 12 is opened and the front end portion of the cartridge 20 is pushed downward. The tray is then released by the locking mechanism 36 and the tray is rotated upward by the coil spring 348 to the loading position as shown in FIG. 9. Then, the user grasps the concave parts 26a and 26b of the memory cartridge 20 by fingers, taking the cartridge 20 out of the loading apparatus.

Although, only one embodiment of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A front loading electronic gaming device adapted for use with a memory cartridge containing a first printed circuit board that has a first plurality of electrical contacts spaced along one board edge, said apparatus comprising:
   a main unit having a front and rear and containing a second printed circuit board having a second plurality of electrical contacts;
   a frame structure mounted to the main unit;
   a cartridge tray pivotally mounted to said frame structure for a rotation within a predetermined angular range between a cartridge loading and a cartridge operating position, and having an opening at one end located at the front of the main unit and adapted to slideably receive the cartridge when the tray is in said cartridge loading position;
   means biasing said cartridge tray toward said cartridge loading position;
   releasable means attached to the frame for locking said cartridge tray in said cartridge operating position; and
   an edge connector mounted within said main unit, said edge connector including a connector housing having upper and lower parallel elongated openings adapted to receive the first and second printed circuit boards, respectively, and a plurality of spring electrodes disposed within said connector housing for providing electrical interconnection between the first and second pluralities of electrical contacts of the first and second printed circuit boards, respectively, said spring electrodes having an offset configuration adapted for relatively low insertion force entry of the contacts of the first printed circuit board when said cartridge tray is in the cartridge loading position and being resiliently movable into positive electrical engagement with the contacts of the first printed circuit board as it is rotated with said cartridge tray into said operating position.

2. The device of claim 1 wherein the tray includes a bottom plate, a pair of opposing side walls adjoining the bottom plate and means attached to the side walls for limiting the upward movement of the cartridge with respect to the tray.

3. The device of claim 1 wherein the connector housing has an upper portion containing the upper opening and wherein the tray includes a rear connecting member extending between the side walls and defining an opening adapted to receive the upper portion of the connector housing.

4. The device of claim 1 wherein the means for biasing includes a coil spring extending between the frame and the tray and a spring shoe in which the spring is seated.

5. The device of claim 1 wherein the cartridge includes a case having opposing stepped portions and wherein the opposing sides of the tray include stepped segments cooperating with the stepped portions of the case to limit the distance to which the cartridge can be inserted in the tray.

6. The device of claim 1 wherein the plurality of spring electrodes within the connector are arranged in spaced cooperating pairs, each pair comprising an inner and an outer electrode and wherein the inner electrode provides a fulcrum upon which the first printed circuit board may be pivoted as it is rotated between the loading and operating positions.

7. The device of claim 1 wherein the bottom plate of the tray includes a rail extending in the direction of insertion of the cartridge for supporting the cartridge.

8. The device of claim 1 wherein the means for locking includes a key mechanism comprising a resilient hook pin and a cooperating cam mechanism comprising a groove which defines the path of the pin when the key and cam mechanisms are engaged.

9. A front loading apparatus for an electronic gaming device adapted for use with a memory cartridge containing a first printed circuit board that has a first plurality of electrical contacts spaced along one board edge, the gaming device including a main unit having a front and rear and containing a second printed circuit board having a second plurality of electrical contacts, said apparatus comprising:

a frame structure mounted to the main unit;

a cartridge tray pivotally mounted to said frame structure for rotation within a predetermined angular range between a cartridge loading and a cartridge operating position, having an opening at one end located at the front of the main unit and adapted to slideably receive the cartridge when the tray is in said cartridge loading position;

means biasing said cartridge tray toward said cartridge loading position;

releasable means attached to the frame for locking said cartridge tray in said cartridge operating position; and an edge connector mounted within said main unit, said edge connector including a connector housing having upper and lower parallel elongated openings adapted to receive the first and second printed circuit boards, respectively, and a plurality of spring electrodes disposed within said connector housing for providing electrical interconnection between the first and second pluralities of electrical contacts of the first and second printed circuit boards, respectively, said spring electrodes having an offset configuration adapted for relatively low insertion force entry of the contacts of the first printed circuit board when said cartridge tray is in the cartridge loading position and being resiliently movable into positive electrical engagement with the contacts of the first printed circuit board as it is rotated with said cartridge tray into said operating position.

10. The apparatus of claim 9 wherein the tray includes a bottom plate, a pair of opposing side walls adjoining the bottom plate and means attached to the side wall for limiting the upward movement of the cartridge with respect to the tray.

11. The apparatus of claim 9 wherein the connector housing has as upper portion containing the upper opening and wherein the tray includes a rear connecting member extending between the side walls and defining an opening adapted to receive the upper portion of the connector housing.

12. The apparatus of claim 9 wherein the means for biasing includes a coil spring extending between the frame and the tray and a spring shoe in which the spring is seated.

13. The apparatus of claim 9 wherein the cartridge includes a case having opposing stepped portions and wherein the opposing sides of the tray include stepped segments cooperating with the stepped portions of the case to limit the distance to which the cartridge can be inserted in the tray.

14. The device of apparatus 9 wherein the plurality of spring electrodes within the connector are arranged in spaced cooperating pairs, each pair comprising an inner and an outer electrode and wherein the inner electrode provides a fulcrum upon which the first printed circuit board may be pivoted as it is rotated between the loading and operating positions.

15. The apparatus of claim 10 wherein the bottom plate of the tray includes a rail extending in the direction of insertion of the cartridge for supporting the cartridge.

16. The apparatus of claim 9 wherein the means for locking includes a key mechanism comprising a resilient hook pin and a cooperating cam mechanism comprising a groove which defines the path of the pin when the key and cam mechanisms are engaged.

17. A front loading apparatus for an electronic gaming device adapted for use with a memory cartridge containing a first printed circuit board that has a first plurality of electrical contacts spaced along one board edge, the gaming device including a main unit having a front and rear and containing a second printed circuit board having a second plurality electrical contacts, said apparatus comprising:

a frame structure mounted to the main unit;

a cartridge tray pivotally mounted to said frame structure for rotation within a predetermined angular range between a cartridge loading and a cartridge operating position, having an opening at one end located at the front of the main unit and adapted to slideably receive the cartridge when the tray is in said cartridge loading position, the tray further having a pair of opposing side walls, a bottom plate extending between the side walls and means attached to the side walls for limiting the upward movement of the cartridge with respect to the tray, the side walls including a pair of opposing offsets cooperating with the cartridge to limit the distance to which the cartridge can be inserted in the tray;

means biasing said cartridge tray toward said cartridge loading position including a coil spring extending between the frame and the tray and a spring shoe in which the spring is seated;

releasable means attached to the frame for locking said cartridge tray in said cartridge operating position; and, an edge connector mounted within said main unit, said edge connector including a connector housing having upper and lower parallel elongated openings adapted to receive the first and second printed circuit boards, respectively, and a plurality of pairs of spring electrodes disposed within said connector housing for providing electrical interconnection between the first and second pluralities of electrical contacts of the first and second printed circuit boards respectively, each pair of comprising an inner and an outer electrode spaced apart to provide relatively low insertion force entry of the contacts of the first printed circuit board when said cartridge tray is in the cartridge loading position and being resiliently movable into positive electrical engagement with the contacts of the first printed circuit board as it is rotated with said cartridge tray into said operating position.

* * * * *